United States Patent
Yoneda et al.

(10) Patent No.: US 11,291,120 B2
(45) Date of Patent: Mar. 29, 2022

(54) OPTICAL MODULE

(71) Applicant: Mitsubishi Electric Corporation, Tokyo (JP)

(72) Inventors: Yutaka Yoneda, Tokyo (JP); Takuro Shinada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/052,293

(22) PCT Filed: Sep. 7, 2018

(86) PCT No.: PCT/JP2018/033228
§ 371 (c)(1),
(2) Date: Nov. 2, 2020

(87) PCT Pub. No.: WO2020/049723
PCT Pub. Date: Mar. 12, 2020

(65) Prior Publication Data
US 2021/0059054 A1    Feb. 25, 2021

(51) Int. Cl.
*H05K 1/00* (2006.01)
*H05K 1/18* (2006.01)
(Continued)

(52) U.S. Cl.
CPC ......... *H05K 1/189* (2013.01); *H01S 5/02253* (2021.01); *H01S 5/02345* (2021.01);
(Continued)

(58) Field of Classification Search
CPC ........ H05K 1/189; H05K 1/028; H05K 1/117; H05K 1/118; H05K 2201/10121; H01S 5/02253; H01S 5/02345; H01S 5/024
(Continued)

(56) References Cited

U.S. PATENT DOCUMENTS

| | | | | |
|---|---|---|---|---|
| 5,838,412 A | * | 11/1998 | Ueda | H05K 3/361 349/150 |
| 2002/0019154 A1 | * | 2/2002 | Na | H05K 1/147 439/76.1 |

(Continued)

FOREIGN PATENT DOCUMENTS

| JP | H06-140686 A | 5/1994 |
|---|---|---|
| JP | 2004-031653 A | 1/2004 |

(Continued)

OTHER PUBLICATIONS

International Search Report; Written Opinion; and Notification of Transmittal of the International Search Report and the Written Opinion of the International Searching Authority, or the Declaration issued in PCT/JP2018/033228; dated Nov. 20, 2018.

(Continued)

*Primary Examiner* — Binh B Tran
(74) *Attorney, Agent, or Firm* — Studebaker & Brackett PC

(57) ABSTRACT

A optical module according to the present invention includes an optical semiconductor device, a package housing the optical semiconductor device, a first pattern provided on an upper surface of the package, a second pattern provided on a side surface continuous with the upper surface of the package, a flexible substrate provided on the first pattern and extending from the upper surface to a side surface side of the package and solder joining the first pattern and the flexible substrate together, wherein the solder is spread between a (Continued)

portion of the flexible substrate, the portion extending from the upper surface to the side surface side of the package, and the second pattern.

15 Claims, 12 Drawing Sheets

(51) Int. Cl.
*H01S 5/02253* (2021.01)
*H01S 5/02345* (2021.01)
*H05K 1/02* (2006.01)
*H05K 1/11* (2006.01)
*H01S 5/024* (2006.01)

(52) U.S. Cl.
CPC .............. *H05K 1/028* (2013.01); *H05K 1/117* (2013.01); *H05K 1/118* (2013.01); *H01S 5/024* (2013.01); *H05K 2201/10121* (2013.01)

(58) Field of Classification Search
USPC ........................................................ 361/749
See application file for complete search history.

(56) References Cited

U.S. PATENT DOCUMENTS

| | | | |
|---|---|---|---|
| 2011/0032962 A1* | 2/2011 | Singer | .................. H01S 5/4031 |
| | | | 372/36 |
| 2016/0356955 A1 | 12/2016 | Sugiyama | |
| 2017/0290099 A1 | 10/2017 | Takebayashi et al. | |

FOREIGN PATENT DOCUMENTS

| | | | |
|---|---|---|---|
| JP | 2005-079145 A | | 3/2005 |
| JP | 2005-302824 A | | 10/2005 |
| JP | 2007-005636 A | | 1/2007 |
| JP | 2017-003655 A | | 1/2017 |
| JP | 2017-183685 A | | 10/2017 |

OTHER PUBLICATIONS

An Office Action; "Notice of Reasons for Refusal", mailed by the Japanese Patent Office dated Jan. 4, 2022, which corresponds to Japanese Patent Application No. 2020-540974 and is related to U.S. Appl. No. 17/052,293; with English language translation.

* cited by examiner

OPTICAL MODULE

FIELD

The present invention relates to an optical module.

BACKGROUND

PTL 1 discloses a connection structure for printed wiring boards in which a group of pads of a first printed wiring board is connected with a group of pads of a second printed wiring board by solder. The second printed wiring board is a flexible printed wiring board. Solder arranged between the group of pads of one wiring board and the group of pads of the other wiring board goes around to a portion on a soldering pattern formed in a region corresponding to a back surface of the group of pads of the other wiring board. Accordingly, solder surrounds an end edge portion of the first printed wiring board.

CITATION LIST

Patent Literature

[PTL 1] JP 2005-302824 A

SUMMARY

Technical Problem

In a case where FPCs (flexible printed circuit) and an optical module are joined together by solder, the FPC is deformed, and a peeling force is applied to a solder joint portion, the peeling force vertically peeling the solder joint portion from the optical module. Thus, it is possible that the solder joint portion comes off or the FPC is ruptured due to a stress concentrated into an end of the solder joint portion.

In order to prevent this, it is possible to cover the solder joint portion by an adhesive. However, in order to harden the joint portion by an adhesive, a separate application process or adhesion process of an adhesive becomes necessary. Thus, a cost increase due to an increase of a manufacturing process may be caused.

In PTL 1, solder is caused to go around to the back surface of the group of pads of the wiring board, and an improvement in strength against peeling is thereby intended. However, a portion in which an electrode circuit is formed on the optical module may be thick compared to a common circuit substrate. Further, in the portion in which an electrode circuit is formed on the optical module, FPCs may be joined to electrode circuits formed on both surfaces by solder joint. Thus, in an optical module, it is possibly difficult for solder to be wet and spread to a surface opposite to an electrode circuit surface.

The present invention has been made for solving the above-described problem, and an object thereof is to obtain an optical module that can improve strength of a solder joint portion.

Solution to Problem

A optical module according to the present invention includes an optical semiconductor device, a package housing the optical semiconductor device, a first pattern provided on an upper surface of the package, a second pattern provided on a side surface continuous with the upper surface of the package, a flexible substrate provided on the first pattern and extending from the upper surface to a side surface side of the package and solder joining the first pattern and the flexible substrate together, wherein the solder is spread between a portion of the flexible substrate, the portion extending from the upper surface to the side surface side of the package, and the second pattern.

Advantageous Effects of Invention

In an optical module according to the invention of this application, a flexible substrate and an upper surface of a package are joined together by solder. This solder is spread between a portion of the flexible substrate, the portion extending from the upper surface to a side surface side of the package, and a second pattern provided on a side surface of the package. Thus, solder may be made thick in a package end portion in which a peeling force is likely to be exerted on the flexible substrate. Consequently, strength of a solder joint portion may be improved.

DESCRIPTION OF EMBODIMENTS

Figure 1:
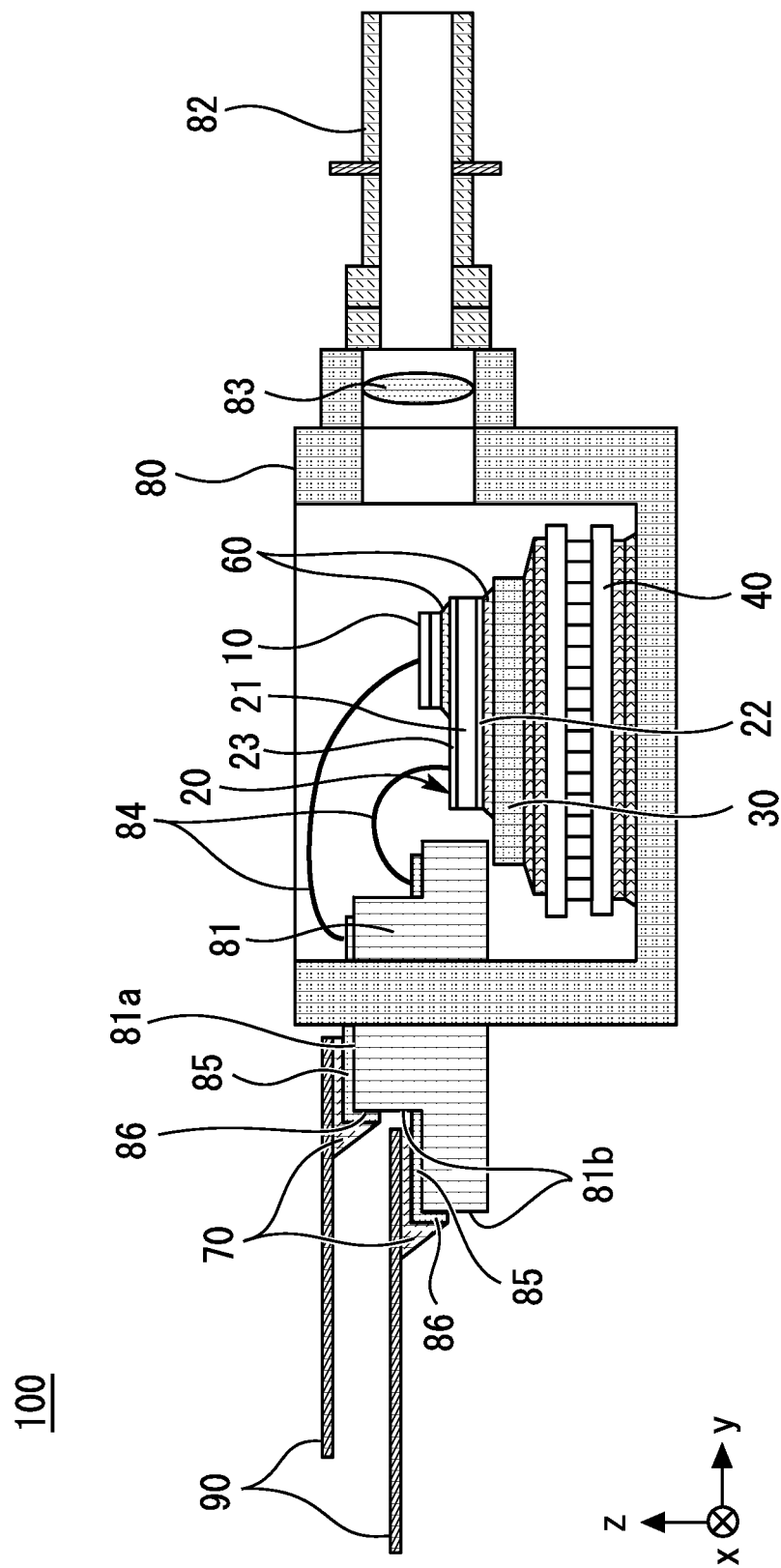
FIG. 1 is a cross-sectional view of an optical module according to a first embodiment.

An optical module according to an embodiment of the present invention are described with reference to drawings. Identical or corresponding constitutional elements are given the same reference numerals, and the repeated description of such constitutional elements may be omitted. The contents of the following descriptions and the drawings do not limit the claims. Further, the sizes or scales of corresponding components are independent from each other among the drawings. For example, between the drawing with a change in a portion of the configuration and the drawing with no change, the sizes or scales of corresponding components may be different.

First Embodiment

Figure 2:
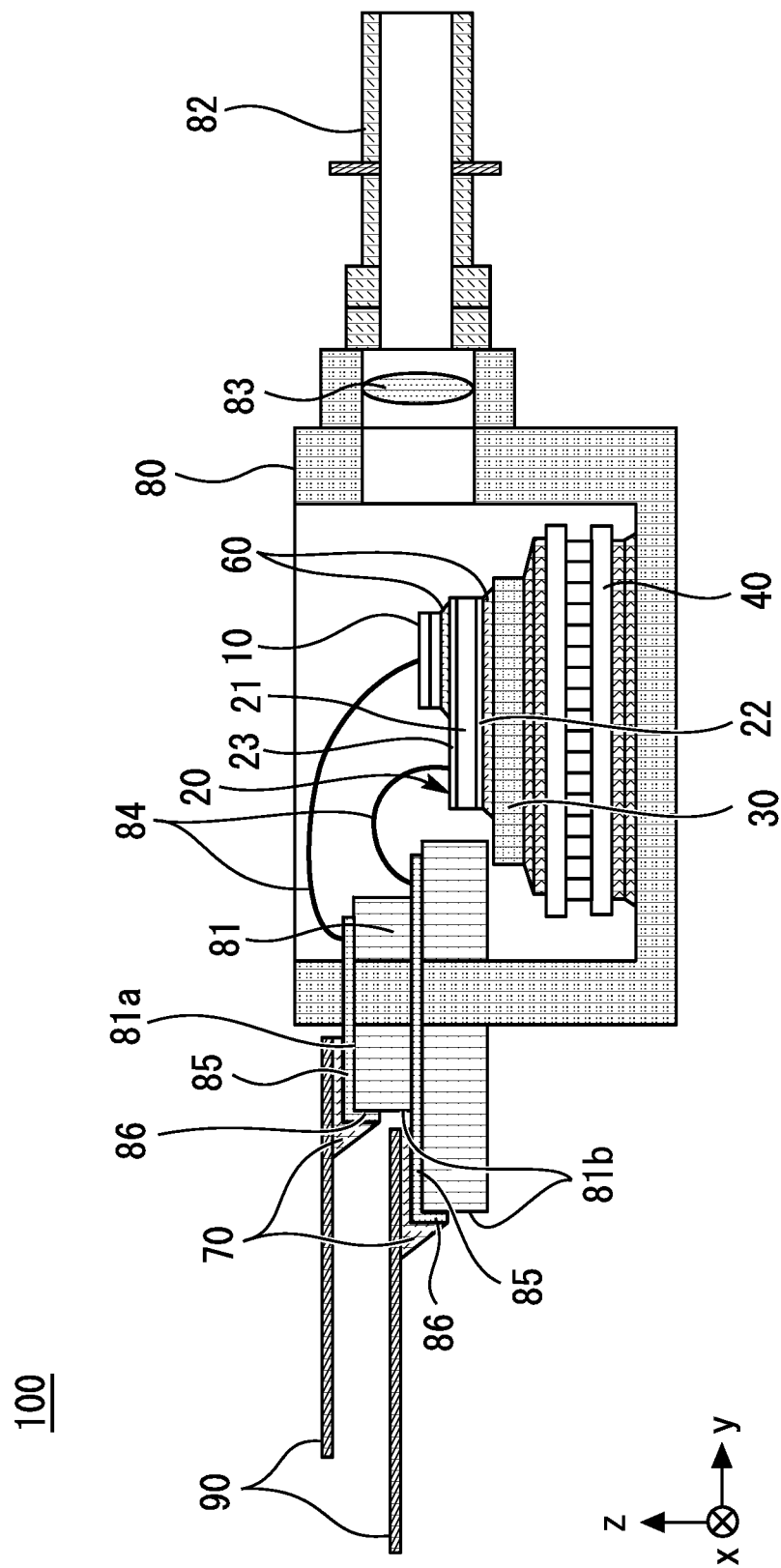
FIG. 2 is another cross-sectional view of the optical module according to the first embodiment.

FIG. 1 is a cross-sectional view of an optical module 100 according to a first embodiment. FIG. 2 is another cross-sectional view of the optical module 100 according to the first embodiment. The optical module 100 is used for optical communication, for example. Note that FIGS. 1 and 2 illustrate only basic configuration portions in the optical module 100 but do not illustrate other configuration portions such as a capacitor.

In the optical module 100, a thermo-module 40 is fixed to a bottom of a case 80. A metal block 30 is fixed to an upper surface of the thermo-module 40. A submount 20 is fixed to an upper surface of the metal block 30. As described above, the submount 20 is mechanically fixed to an internal portion of the case 80 on a surface opposite to an optical semiconductor device 10.

The optical module 100 includes the optical semiconductor device 10. The optical semiconductor device 10 is a semiconductor laser chip. The optical semiconductor device 10 is joined to an upper surface of the submount 20 by solder 60. The optical semiconductor device 10 is housed in the case 80.

In the case 80, a feedthrough 81 is provided on an opposite side of a laser output direction of the optical semiconductor device 10. The case 80 and the feedthrough 81 configure a package housing the optical semiconductor device 10. The feedthrough 81 passes through from an inside to an outside of the case 80. The feedthrough 81 electrically connects together the inside and outside of the case 80. The feedthrough 81 is formed in stair shapes on both of the inside and outside of the case 80.

A first pattern 85 is provided on an upper surface 81a of the feedthrough 81. As illustrated in FIG. 2, the first pattern 85 passes through from the inside to the outside of the case 80. Accordingly, the outside and inside of the case 80 are electrically connected together. A second pattern 86 is provided on a side surface 81b continuous with the upper surface 81a of the feedthrough 81. The first pattern 85 is continuous with the second pattern 86.

The first pattern 85 and the second pattern 86 are electrode circuits of the optical semiconductor device 10. One of an anode and a cathode of the optical semiconductor device 10 is electrically connected with the first pattern 85 on an upper stage side of the feedthrough 81 via a wire 84. The other of the anode and cathode of the optical semiconductor device 10 is electrically connected with the first pattern 85 on a lower stage side of the feedthrough 81 via the solder 60, the submount 20, and the wire 84. As described above, the first pattern 85 is electrically connected with the optical semiconductor device 10 on an internal surface of the case 80.

On the outside of the case 80, one end of a flexible substrate 90 is connected with each of the first patterns 85 on the upper stage and lower stage of the feedthrough 81. The first pattern 85 and the flexible substrate 90 are joined together by solder 70. The flexible substrate 90 is provided on the first pattern 85 and extends from the upper surface 81a to the side surface 81b side. The other end of the flexible substrate 90 is electrically connected with an external electronic circuit not illustrated. Accordingly, the optical semiconductor device 10 is electrically connected with the external electronic circuit. The flexible substrate 90 electrically connects the optical semiconductor device 10 in the case 80 with the external electronic circuit.

Each configuration element will be described in detail. The optical semiconductor device 10 performs conversion from an electric signal to an optical signal and inverse conversion to that. In this embodiment, the optical semiconductor device 10 is an LD (laser diode), but the optical semiconductor device 10 may be a PD (photo diode) or the like. Further, in the first embodiment, one laser light generation unit is formed in the optical semiconductor device 10. Although not limited to this, a plurality of laser light generation units may be formed in the optical semiconductor device 10. Further, in the first embodiment, one optical semiconductor device 10 is provided. Although not limited to this, a plurality of optical semiconductor devices 10 may be provided.

The submount 20 has a ceramic base material 21, an electrode pattern 22 formed on one of both surfaces in the thickness direction of the ceramic base material 21, and an electrode pattern 23 formed on the other. The ceramic base material 21 is an electric insulator. In order to effectively cool the optical semiconductor device 10, the ceramic base material 21 is preferably formed of a material with high thermal conductivity. As the ceramic base material 21, for example, a ceramic plate of AlN, Al2O3, or the like with a thickness of 0.3 mm is used.

In the first embodiment, although only one optical semiconductor device 10 is joined to the submount 20, a plurality of optical semiconductor devices 10 may be joined to one submount 20. In the first embodiment, the number of submounts 20 is one, but the number of the submounts 20 is not limited to one.

The optical semiconductor device 10 is joined, by the solder 60, to the electrode pattern 23 on the upper surface side of the submount 20, the upper surface side corresponding to a circuit surface side. Further, a joint portion is formed with an Au wire or the like on the electrode pattern 23. Accordingly, the electrode pattern 23 is electrically connected with a peripheral member or a surface of the optical semiconductor device 10.

Such an electrode pattern 23 is a wiring member for electrically connecting the optical semiconductor device 10 with an external circuit. Thus, the electrode pattern 23 is preferably formed of metal with a small electric resistance. Further, the electrode patterns 22 and 23 formed on both surfaces of the ceramic base material 21 may be formed of the same material. Further, for the electrode patterns 22 and 23 formed on both surfaces of the ceramic base material 21, for example, metallization with Au or the like with a thickness of approximately 3.0 μm or thinner is used.

The electrode pattern 22 on a lower surface side of the submount 20, the lower surface side corresponding to a heat dissipation surface side, is mechanically and thermally connected with an internal wall of the case 80 via solder or the like.

The submount 20 is joined to the case 80 after the optical semiconductor device 10 is joined to the submount 20 by the solder 60. Further, the flexible substrate 90 is joined to the feedthrough 81 after the optical semiconductor device 10 is joined to the submount 20 by the solder 60. Thus, a material of the solder 60 is preferably metal with a higher melting point than the solder 70 and with high thermal conductivity so that the solder 60 does not remelt in joining by the solder 70. For the solder 60, an alloy mainly containing Au, Sn, Ge, or the like with a melting point of 250° C. or higher may be used. Further, the thickness of the solder 60 is preferably set to 0.1 mm or thinner in view of heat dissipation.

The solder 70 joins the first pattern 85 and an electrode circuit provided at one end of the flexible substrate 90 together. When the flexible substrate 90 is joined by the solder 70, the submount 20 to which the optical semiconductor device 10 is joined by the solder 60 is joined in the case 80. Thus, a material of the solder 70 is preferably metal with a lower melting point than the solder 60 and with high thermal conductivity so that the solder 60 does not remelt in joining by the solder 70. Thus, for the solder 70, an alloy mainly containing Sn, Ag, Cu or the like with a melting point of 250° C. or lower may be used.

The case 80 has a bottom portion in a flat-plate shape and a plurality of side portions continuous with an outer edge of the bottom portion. The bottom portion of the case 80 is mechanically and thermally connected with the submount 20 by solder or the like. An opening surrounded by the plurality of side portions is formed on the upper surface side of the case 80. The case 80 is a flat box, for example.

Further, in one side portion of the case 80, a receptacle 82 is provided which is for guiding laser light emitted from the optical semiconductor device 10 to an optical fiber not illustrated. A light emission unit of the package is sealed by a lens 83. In the side portion of the case 80 opposed to the side portion in which the receptacle 82 is provided, the feedthrough 81 is provided.

The feedthrough 81 becomes an input-output port of an electric signal for an external electronic circuit not illustrated. The feedthrough 81 is formed by laminating ceramics, for example. The upper surface 81a of the feedthrough 81 is parallel with the opening and the bottom portion of the case 80. Further, the side surface 81b of the feedthrough 81 is parallel with the side portion of the case 80.

Figure 3:
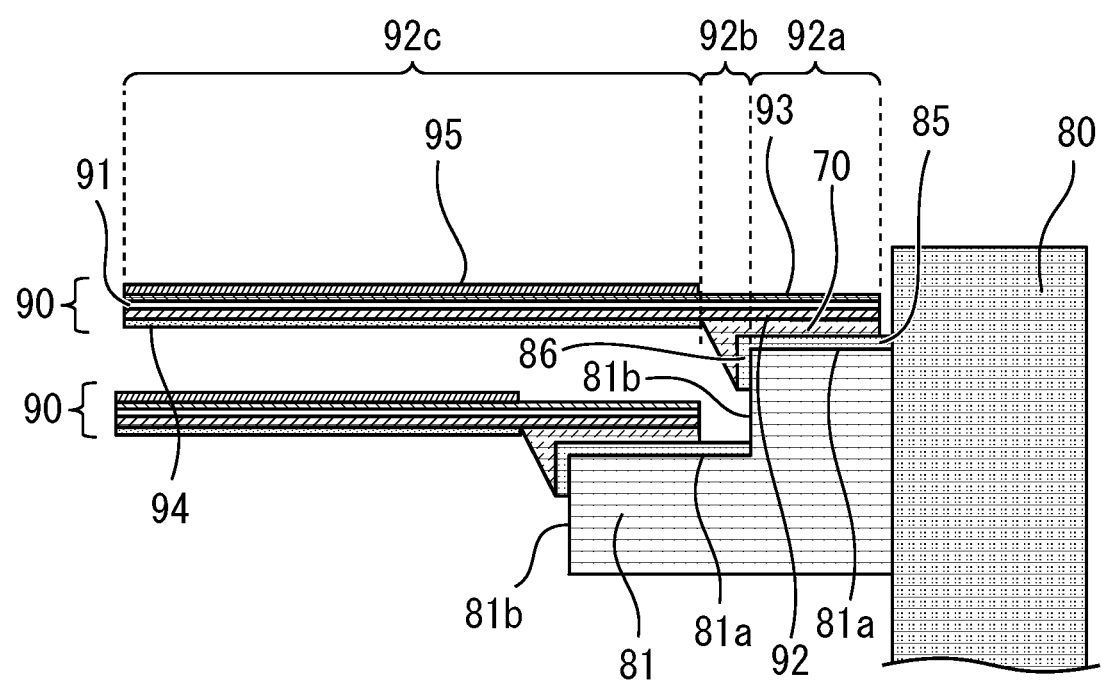
FIG. 3 is a cross-sectional view illustrating a structure of the flexible substrate according to the first embodiment.

FIG. 3 is a cross-sectional view illustrating a structure of the flexible substrate 90 according to the first embodiment. The flexible substrate 90 is an electric interface member. The flexible substrate 90 has a belt shape. One end of the flexible substrate 90 is electrically connected with the first pattern 85 and the second pattern 86 by the solder 70, and the other end is electrically connected with a substrate of a transmitter-receiver not illustrated.

The flexible substrate 90 has a base 91 as a substrate material. The base 91 is formed of polyimide, for example, and is capable of being flexed. Further, the flexible substrate 90 has electrodes 92 and 93 on both surfaces of the base 91. The electrodes 92 and 93 are formed of a metal material with a small electric resistance such as Au or Cu. The electrodes 92 and 93 are patterns formed by a method such as plating or printing.

A lower surface of the electrode 92 is covered by a cover lay 94. Further, an upper surface of the electrode 93 is covered by a cover lay 95. The cover lays 94 and 95 protect the electrodes 92 and 93. The cover lays 94 and 95 are formed of a dielectric material such as polyimide the same as the base 91. The electrodes 92 and 93 have covered portions covered by the cover lays 94 and 95. Further, end portions of the electrodes 92 and 93 on the feedthrough 81 side are exposed from the cover lays 94 and 95.

The electrode 92 has a first exposed portion 92a, a second exposed portion 92b, and a covered portion 92c. The first exposed portion 92a is provided directly above the upper surface 81a of the feedthrough 81, is exposed from the cover lay 94, and is joined to the first pattern 85 by the solder 70. The covered portion 92c is covered by the cover lay 94. The second exposed portion 92b couples the first exposed portion 92a and the covered portion 92c together, is exposed from the cover lay 94, and is provided on the outside of the upper surface 81a of the feedthrough 81 when seen in a direction perpendicular to the upper surface 81a. The solder 70 is spread from a portion between the first exposed portion 92a and the first pattern 85 to the second exposed portion 92b. In this embodiment, the solder 70 is spread to an end portion of the second exposed portion 92b, the end portion being adjacent to the covered portion 92c.

Further, the solder 70 is spread between a portion of the flexible substrate 90, the portion extending from the upper surface 81a to the side surface 81b side of the feedthrough 81, and the second pattern 86. In other words, the second pattern 86 is joined to the electrode 92 by the solder 70. The solder 70 is spread to a lower end of the second pattern 86.

Figure 4:
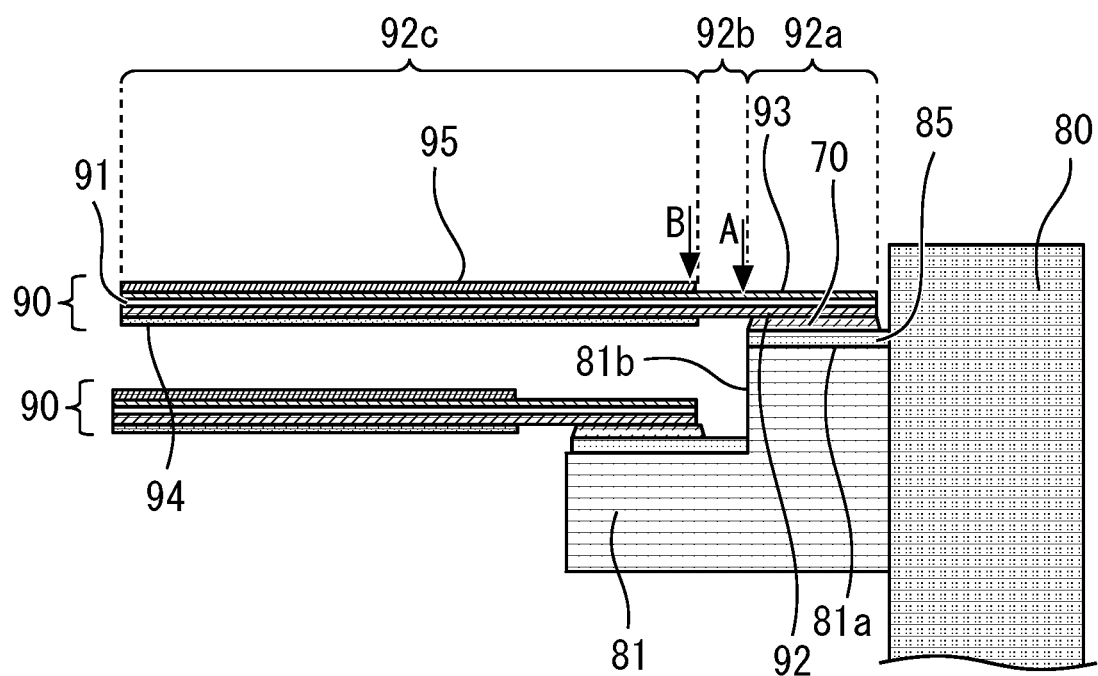
FIG. 4 is a cross-sectional view of an optical module according to a comparative example.

Next, effects of the optical module 100 will be described. FIG. 4 is a cross-sectional view of an optical module 101 according to a comparative example. In the optical module 101, the second pattern 86 is not provided. Further, the solder 70 is provided between the electrode 92 and the first pattern 85.

The cover lays 94 and 95 commonly protect the electrodes 92 and 93 in order to inhibit rupture and disconnection in deformation. However, a portion of the electrode 92 may be formed which is adjacent to an end portion of the first pattern 85 and is not covered by the cover lay 94. This occurs due to manufacturing errors of the cover lays 94 and 95 or non-uniformity of positional precision between the first pattern 85 and the flexible substrate 90.

When an end portion of the flexible substrate 90 is connected with the substrate of the transmitter-receiver, the position of the optical module 101 is commonly determined with respect to the receptacle 82 as a reference. Thus, the assembly tolerance of the optical module 101 and the transmitter-receiver is absorbed by the flexible substrate 90. Furthermore, the deformation of the transmitter-receiver corresponding to the difference in the thermal expansion coefficient is absorbed by the flexible substrate 90. Thus, flection is likely to occur to the flexible substrate 90.

In general, in a state where the flexible substrate 90 is flexed, a stress is likely to be applied in a direction to peel the flexible substrate 90 from the package. In other words, a stress is likely to be applied in a direction perpendicular to the upper surface 81a of the feedthrough 81. Here, the second exposed portion 92b becomes a bending point, the second exposed portion 92b being a gap in which the electrode 92 is not protected by the cover lay 94 and which is not joined to the first pattern 85 and is indicated by arrows A and B.

For example, it is possible that the flexible substrate 90 deforms from an end portion of the solder 70 wet and spread on the flexible substrate 90. Further, in a case where the solder thickness is thin, it is possible that the solder 70 wet and spread on the flexible substrate 90 is destroyed and the flexible substrate 90 deforms from an end portion of the first pattern 85. Thus, a stress is likely to be concentrated into the gap indicated by the arrows A and B, and rupture or disconnection may occur to the flexible substrate 90.

To prevent this, it is possible that the solder 70 is wet and spread to an end point of the cover lay 94 on the electrode 92, the end point being indicated by the arrow B, and the solder thickness is thickened so that the solder 70 wet and spread on the electrode 92 does not crack in flection. However, the optical module 101 illustrated in FIG. 4 is provided with a pattern in which the solder 70 is wet and spread only on the upper surface 81a. Thus, it is difficult to wet and spread the solder 70 thickly on the electrode 92 protruded from the first pattern 85.

On the other hand, in this embodiment, as illustrated in FIG. 3, in addition to the first pattern 85, the second pattern 86 is provided to the feedthrough 81 so as to elongate the first pattern 85 to the side surface 81b. Thus, the solder 70 wet and spread on the first pattern 85 is further wet and spread to the second pattern 86. In this case, a portion of the solder 70 wet and spread on the second pattern 86 and a portion wet and spread to the second exposed portion 92b form a solder fillet whose cross section is a generally triangular shape. In other words, a solder fillet is formed which has a generally triangular cross-sectional shape whose vertices are a connection point between the feedthrough 81 and the flexible substrate 90, an end portion of the second exposed portion 92b, the end portion being adjacent to the covered portion 92c, and the lower end of the second pattern 86.

Here, the second pattern 86 is formed generally perpendicularly to the electrode 92. Thus, the solder 70 wet and spread on the second exposed portion 92b may be formed to be as thick as the length of the second pattern 86. In other words, the solder 70 may thickly be provided in the perpendicular direction with respect to a direction in which the flexible substrate 90 extends from the first pattern 85. Consequently, the thick solder 70 may be formed on the second exposed portion 92b.

In addition, among portions becoming bending points when the flexible substrate 90 is flexed, the stress is considered to be most concentrated into the connection point between the feedthrough 81 and the flexible substrate 90, which is indicated by the arrow A in FIG. 4. In this embodiment, the solder 70 may be made thickest in this portion.

Based on the above, concentration of a stress may be inhibited against bend, tension, or rotation of the flexible substrate 90. Consequently, exfoliation or rupture of the solder 70 may be inhibited, and the strength of a solder joint portion may be improved. Further, a portion of the flexible substrate 90 into which a stress is concentrated is reinforced by the solder 70. Thus, the strength of the flexible substrate 90 may be improved. Consequently, reliability of the optical module 100 may be improved, and a long life may be realized.

Further, as another method for inhibiting rupture of the solder 70, it is possible to reinforce the second exposed portion 92b by using a resin, an adhesive, or the like. However, in a case where reinforcement is performed by a resin, a separate process of applying a resin to the second exposed portion 92b and a separate process of curing the applied resin are necessary after the feedthrough 81 and the flexible substrate 90 are joined together by the solder 70. Consequently, long time may be requested for assembly of the optical module.

In contrast, in this embodiment, the solder 70 may thickly be formed on the second exposed portion 92b in a process of joining the flexible substrate 90 to the feedthrough 81 by the solder 70, the process being commonly conducted in an assembly process of the optical module. Consequently, similar effects to a case where reinforcement is performed by a resin may be obtained in shorter time than the case where reinforcement is performed by a resin. Further, compared to a case where reinforcement of the flexible substrate 90 is not performed, the time requested for the assembly process may be inhibited from becoming long. Consequently, an inexpensive optical module 100 may be obtained.

In this embodiment, the flexible substrate 90 is provided on the opposite side from a light emission side of the optical semiconductor device 10 in the package. Although not limited to this, in a case where the optical semiconductor device 10 is a PD, the flexible substrate 90 may be provided on the opposite side from a light incident side of the optical semiconductor device 10 in the package.

Further, in this embodiment, the first pattern 85 and the second pattern 86 form one continuous pattern. Although not limited to this, as long as the solder 70 may be wet and spread from the first pattern 85 to the second pattern 86, the first pattern 85 and the second pattern 86 may be apart from each other.

Further, a description is made about the optical module 100 as an example in this embodiment; however, this embodiment may be applied to connection between a semiconductor apparatus being for power or dealing with a normal current and the flexible substrate 90.

Figure 5:
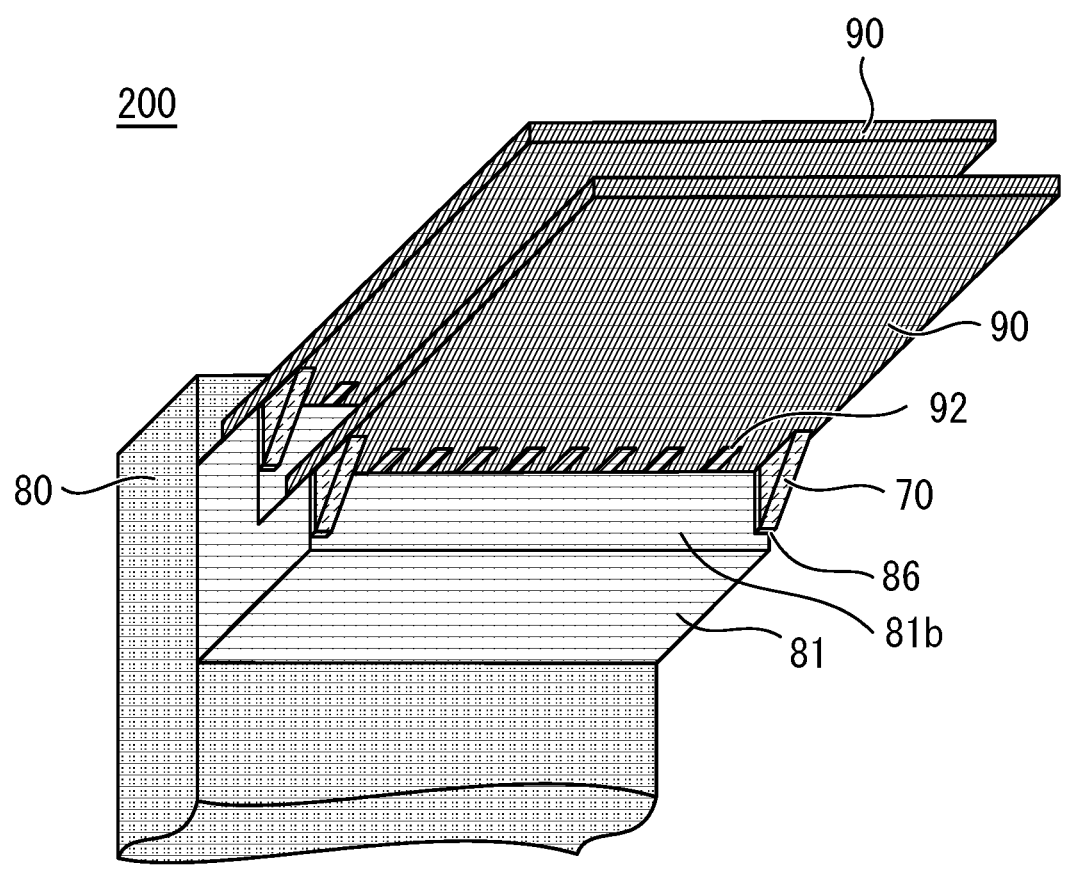
FIG. 5 is a perspective view of an optical module according to a modification example of the first embodiment.

FIG. 5 is a perspective view of an optical module 200 according to a modification example of the first embodiment. A plurality of first patterns 85 are provided to the feedthrough 81. Further, the flexible substrate 90 includes a plurality of electrodes 92. The plurality of first patterns 85 are joined to respective ones of the plurality of electrodes 92. The plurality of first patterns 85 and the plurality of electrodes 92 are aligned along the side surface 81b of the feedthrough 81.

Here, in the optical module 100, the second patterns 86 are formed for all the first patterns 85. In other words, the generally triangular fillets are formed for all the electrodes 92 formed in the flexible substrate 90, thereby performing reinforcement.

However, the second patterns 86 do not have to be formed for all the first patterns 85. Only a necessary number of second patterns 86 for inhibiting concentration of a stress may be formed. For example, as illustrated in FIG. 5, the second patterns 86 may be provided in the positions corresponding to the first patterns 85 at both ends among the plurality of first patterns 85. Accordingly, the solder 70 is thickly formed at both ends of the flexible substrate 90.

These modifications can be applied, as appropriate, to an optical module according to the following embodiments. Note that the optical modules according to the following embodiments are similar to that of the first embodiment in many respects, and thus differences between the optical module according to the following embodiments and those of the first embodiment will be mainly described below.

Second Embodiment

Figure 6:
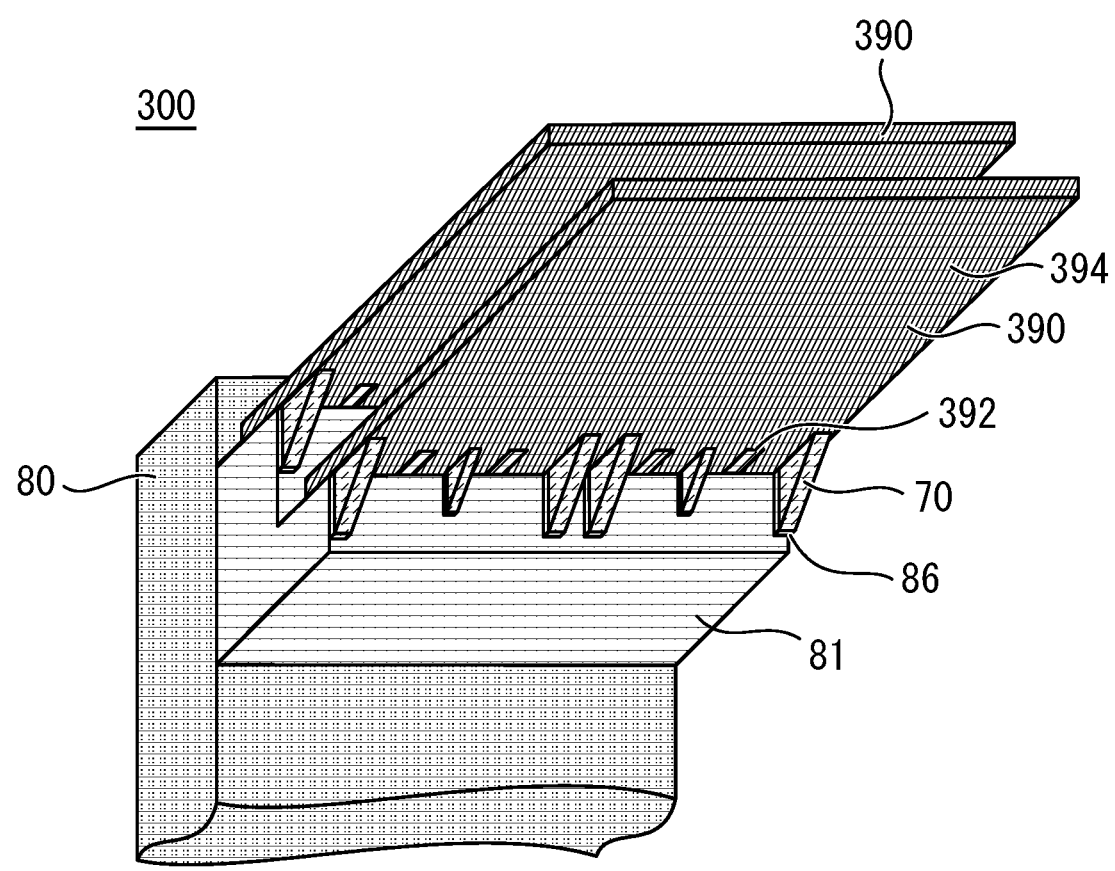
FIG. 6 is a perspective view of an optical module according to a second embodiment.
Figure 7:
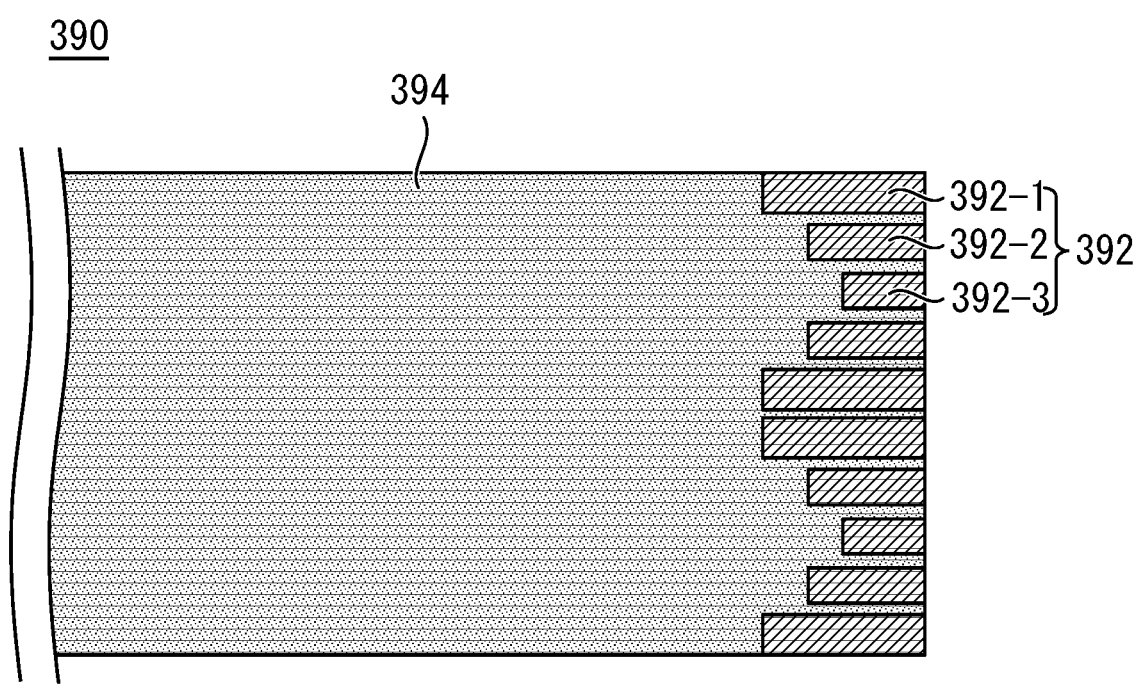
FIG. 7 is a plan view of a flexible substrate according to the second embodiment.

FIG. 6 is a perspective view of an optical module 300 according to a second embodiment. FIG. 7 is a plan view of a flexible substrate 390 according to the second embodiment. In the first embodiment, all portions of the plurality of electrodes 92 exposed from the cover lay 94 have the same length. In contrast, in this embodiment, as illustrated in FIG. 7, the lengths of portions of a plurality of electrodes 392 exposed from a cover lay 394 are different in accordance with the positions.

The plurality of electrodes 392 include electrodes 392-1, 392-2, and 392-3. The electrodes 392-1 at both ends and in central portions have longer second exposed portions 92b than the other electrodes 392-2 and 392-3. The second exposed portions 92b become shorter as those are separated farther from the electrodes 392-1. The electrode 392-3 arranged at the center of two electrodes 392-1 has the shortest second exposed portion 92b. The electrode 392-2 between the electrode 392-1 and the electrode 392-3 has the second exposed portion 92b shorter than the electrode 392-1 and longer than the electrode 392-3.

In this case, as illustrated in FIG. 6, plural pieces of solder 70 are aligned in a direction along the side surface 81b of the feedthrough 81. Further, the fillet of the solder 70 may be formed larger in a part in which the second exposed portion 92b is longer. Consequently, among the plural pieces of solder 70, the pieces of solder 70 joining the first patterns 85 at both ends and in central portions extend farther from the upper surface 81a of the feedthrough 81 than the other pieces of solder 70.

In this embodiment, the positions of end points of the cover lay 394 are different in accordance with the plurality of electrodes 392. Accordingly, the positions into which a stress is concentrated in deformation of the flexible substrate 390 may be dispersed. Thus, the whole flexible substrate 390 may be inhibited from largely bending in one position, and disconnection of the electrode 392 may be inhibited.

In addition, in the electrodes 392 at both ends of the flexible substrate 90, portions joined by the solder 70 may be made long. Here, at both of the ends of the flexible substrate 390, the deformation amounts are largest with respect to bend, tension, and particularly rotation. In this embodiment, in the electrodes 392 in the portions with large deformation amounts of the flexible substrate 390, the solder joint portions may be reinforced by largely forming the fillets. Consequently, disconnection of the flexible substrate 390 may be inhibited, and a long life of the optical module 300 may be realized.

Note that in this embodiment, as illustrated in FIG. 6, the second patterns 86 are provided in the positions corresponding to the electrodes 392-1 and 392-3 among the plurality of electrodes 392. Although not limited to this, the second patterns 86 may be provided in the positions corresponding to all the electrodes 392.

Further, in this embodiment, the lengths of the second exposed portions 92b of the plurality of electrodes 392 are changed, and the sizes of the fillets of the solder 70 are thereby adjusted. Although not limited to this, the sizes of the fillets of the solder 70 may be adjusted by adjusting the lengths of the second patterns 86.

Further, in this embodiment, the second exposed portions 92b are formed long in the electrodes 392-1 at both of the ends and in the central portions. Although not limited to this, it is sufficient that the plurality of electrodes 392 have the second exposed portions 92b with different lengths. Accordingly, portions of the plural pieces of solder 70 spread between the flexible substrate 390 and the second patterns 86 are formed such that the lengths from the upper surface 81a are different. Consequently, an effect of dispersing the stress in deformation of the flexible substrate 390 may be obtained.

Third Embodiment

Figure 8:
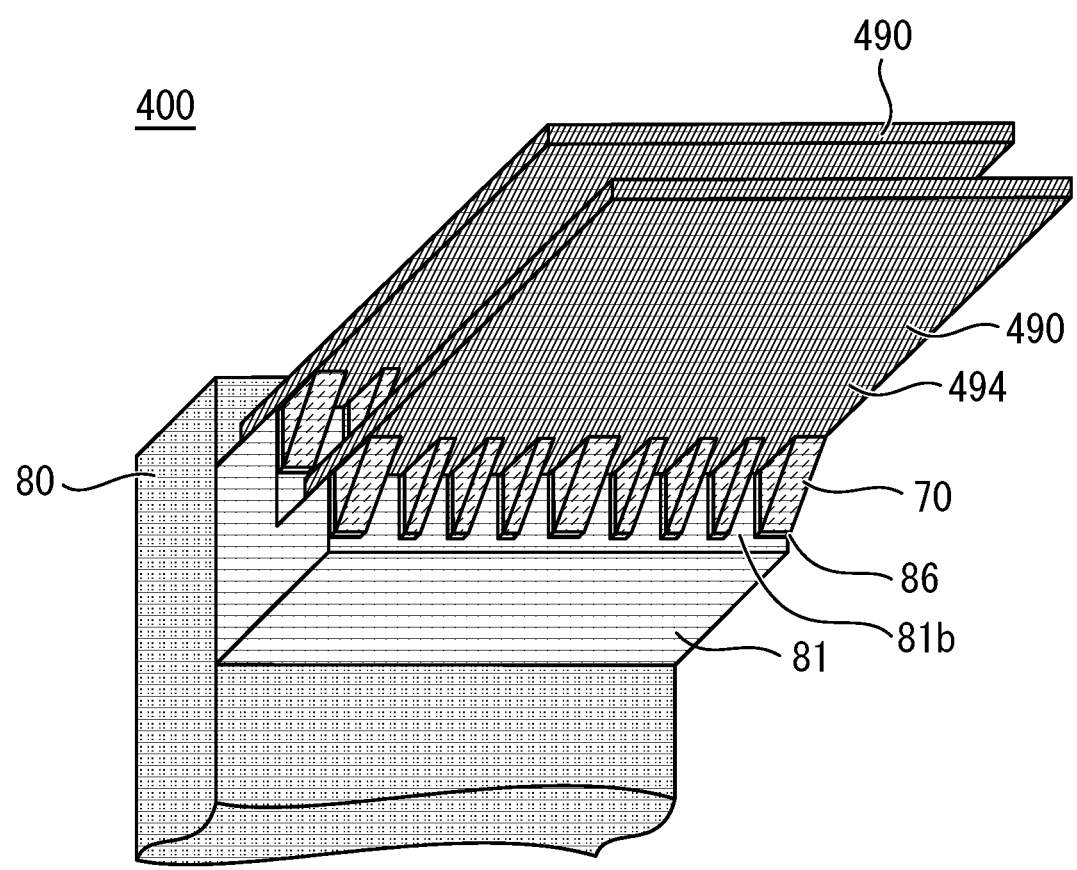
FIG. 8 is a perspective view of an optical module according to a third embodiment.
Figure 9:
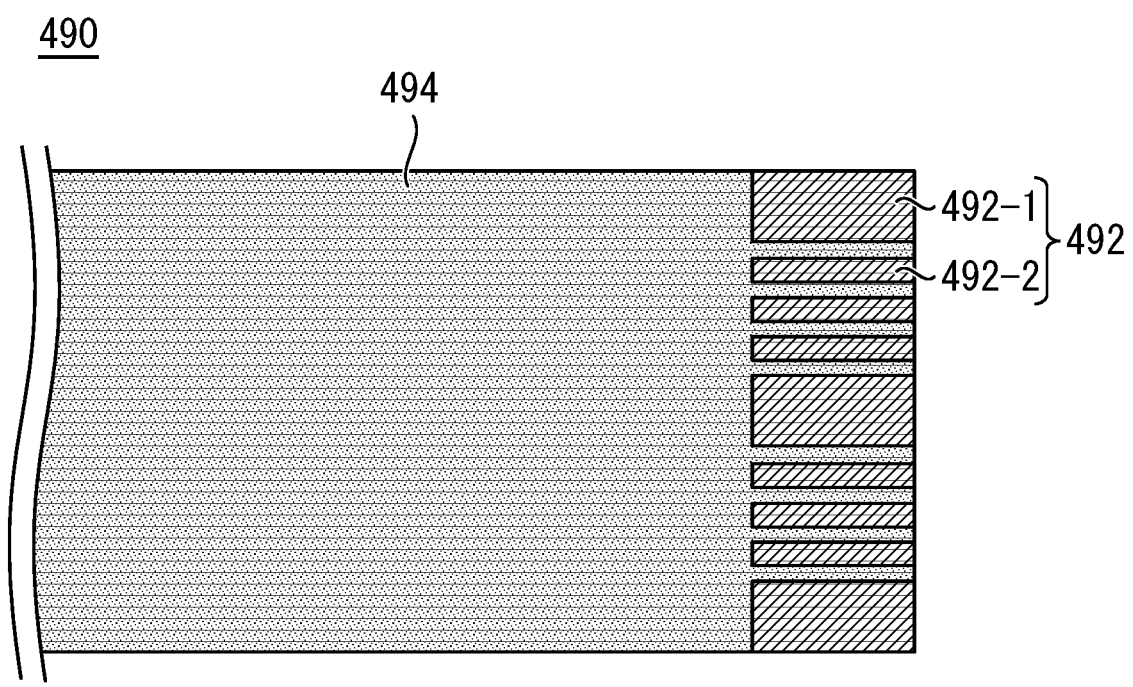
FIG. 9 is a plan view of a flexible substrate according to the third embodiment.

FIG. 8 is a perspective view of an optical module 400 according to a third embodiment. FIG. 9 is a plan view of a flexible substrate 490 according to the third embodiment. In the first embodiment, all the electrodes 92 of the flexible substrate 90 have the same width. In contrast, in this embodiment, the widths of electrodes 492 are different in accordance with the positions.

A plurality of electrodes 492 include electrodes 492-1 and 492-2. Among the plurality of electrodes 492, the electrodes 492-1 at both ends and in a central portion have wider widths in a direction along the side surface 81b of the feedthrough 81 than the other electrodes 492-2.

As the width of the electrode 492-1 becomes thicker, the width of the fillet formed with the solder 70 becomes thicker. In other words, among the plural pieces of solder 70, the pieces of solder 70 joining the first patterns 85 at both ends and in a central portion have wider widths in the direction along the side surface 81b than the other pieces of solder 70.

Thus, fillets may be reinforced, the fillets being formed for the electrodes 492-1 at both ends, with large deformation amounts, of the flexible substrate 490. Consequently, disconnection of the flexible substrate 490 may be inhibited, and a long life of the optical module 400 may be realized.

Further, in this embodiment, the widths of the plurality of electrodes 492 are changed, and the widths of the fillets of the solder 70 are thereby adjusted. Although not limited to this, the widths of the fillets of the solder 70 may be adjusted by adjusting the widths of the second patterns 86.

Further, it is sufficient that the plurality of electrodes 492 have different widths in the direction along the side surface 81b of the feedthrough 81 in accordance with the manner of deformation of the flexible substrate 490. Accordingly, portions of the plural pieces of solder 70 spread between the flexible substrate 490 and the second patterns 86 are formed such that the widths in the direction along the side surface 81b are different. Consequently, the fillets may be reinforced in accordance with the deformation of the flexible substrate 490.

Further, effects of a configuration of this embodiment may further be improved by using the configuration in combination with a configuration of the second embodiment.

Fourth Embodiment

Figure 10:
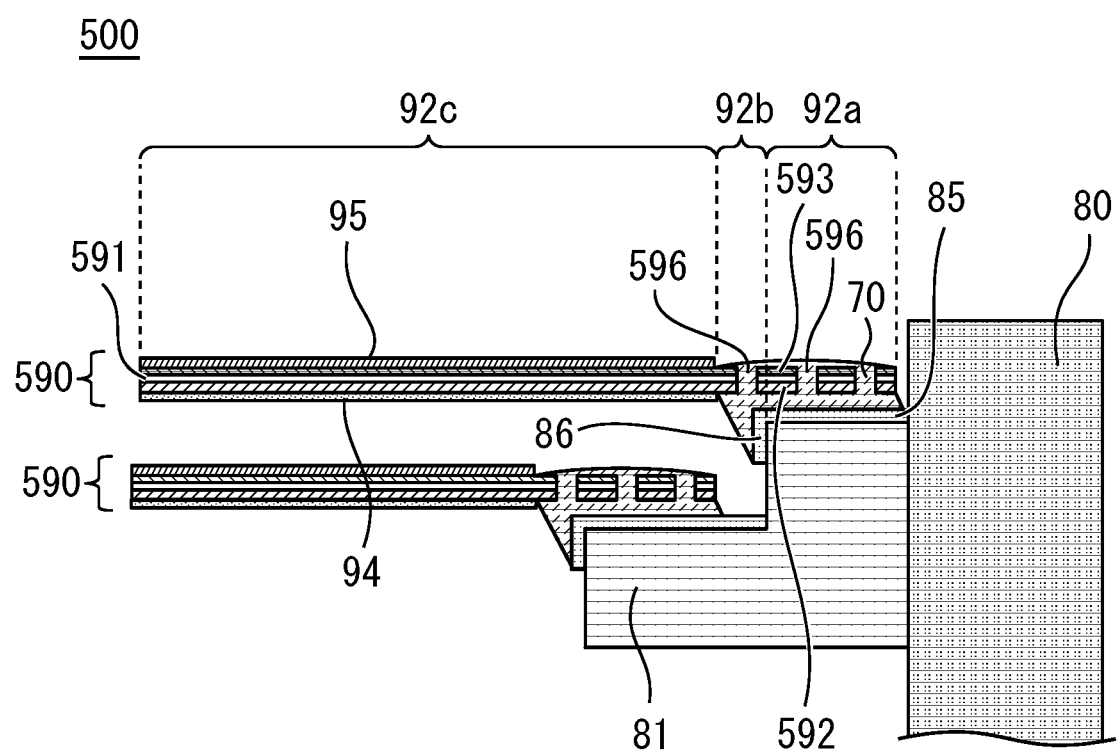
FIG. 10 is a cross-sectional view of an optical module according to a fourth embodiment.
Figure 11:
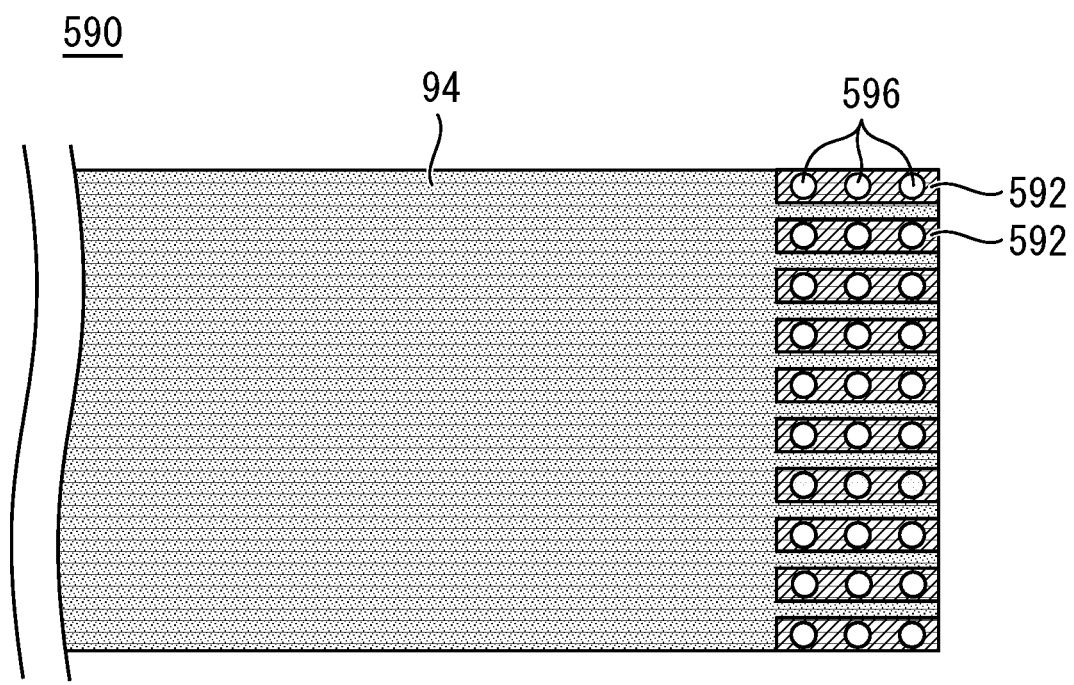
FIG. 11 is a plan view of a flexible substrate according to the fourth embodiment.

FIG. 10 is a cross-sectional view of an optical module 500 according to a fourth embodiment. FIG. 11 is a plan view of a flexible substrate 590 according to the fourth embodiment. Through holes 596 are formed in the first exposed portions 92a and the second exposed portions 92b of the flexible substrate 590. The solder 70 is provided in the through holes 596.

The flexible substrate 590 has a base 591, electrodes 592 and 593 provided on both surfaces of the base 591, and the cover lays 94 and 95 covering the electrodes 592 and 593. The through hole 596 passes through the base 591 and the electrodes 592 and 593. A plurality of through holes 596 are formed to the vicinities of end portions of the second exposed portions 92b, the end portions being adjacent to the cover lay 94.

As illustrated in FIG. 11, the plurality of through holes 596 are provided to all the electrodes 592. The plurality of through holes 596 are formed, at regular intervals, from end portions on sides of the electrodes 592, on which the electrodes 592 are joined to the first patterns 85 by solder, to the vicinities of end points of the cover lay 94. Because the solder 70 is provided in the through hole 596, the electrodes 592 and the electrode 593 become electrically continuous and have the same electric potential. An end portion of the electrode 593 on the feedthrough 81 side is exposed from the cover lay 95.

In a case where the flexible substrate 590 is joined to the feedthrough 81 by solder, the solder 70 supplied onto the first pattern 85 and melt is first wet and spread to the second exposed portion 92b of the electrode 592 of the flexible substrate 590. The solder 70 is thereafter wet and spread into the through hole 596. Accordingly, the through hole 596 is filled with the solder 70. Then, the excess solder 70 is wet and spread from the through hole 596 to the electrode 593. When the solder 70 is wet and spread to the other adjacent through hole 596, the inside of the adjacent through hole 596 is filled with the solder 70 by the surface tension of the solder 70.

Similarly, the through hole formed in the vicinity of the end point of the cover lay 94 is filled with the solder 70. Accordingly, the solder 70 is wet and spread to all portions of the electrodes 592 and 593, the portions being not protected by the cover lays 94 and 95. A fillet is formed with this portion and a portion in which the solder 70 is wet and spread to the second pattern 86. Accordingly, the fillet may further efficiently be formed in the solder 70.

Furthermore, compared to the first embodiment, the thermal capacities of the electrodes 592 and 593 decrease by the amounts of the through holes 596. Thus, the temperatures of the electrodes 592 and 593 easily rise by heating. Consequently, the solder 70 may easily be wet and spread on whole surfaces of portions of the electrodes 592 and 593, the portions being exposed from the cover lays 94 and 95.

In addition, the solder 70 is wet and spread to the electrode 593 through the through hole 596. Accordingly, both surfaces of the flexible substrate 590 are protected by the solder 70. Consequently, the solder 70 may be made more unbreakable against bend, tension, and rotation of the flexible substrate 590. Thus, disconnection of the electrodes 592 and 593 may further be inhibited, and a longer life of the optical module 500 may be realized.

Further, in this embodiment, the through hole 596 is circular, and three through holes 596 are provided to one electrode 592. The three through holes 596 are formed at both ends and at the center of a portion of the electrode 592, the portion being not protected by the cover lay 94. The shape, positions, and number of through holes 596 are not limited to those; however, it is sufficient that the solder 70 is wet and spread on the whole surfaces of portions not protected by the cover lays 94 and 95 in portions, which are protruded from the feedthrough 81, of the electrodes 592 and 593. Note that the through holes 596 are provided such that those do not cause disconnection of the electrodes 592 and 593.

For example, the through hole 596 may be formed in one of the first exposed portion 92a and the second exposed portion 92b of the flexible substrate 590. In this case, the through hole 596 is preferably formed in the second exposed portion 92b. Further, the through hole 596 may be longitudinally long in a direction perpendicular to the side surface 81b of the feedthrough 81. For example, in a position at 0.25 mm outward of the feedthrough 81 from an end portion of the feedthrough 81, one elliptical through hole 596 with a width of 0.15 mm and a length of 0.25 mm may be provided to each of the electrodes 592. In this case, it is assumed that the width of the electrode 592 is 0.3 mm and the length of the second exposed portion 92b is 0.5 mm.

Figure 12:
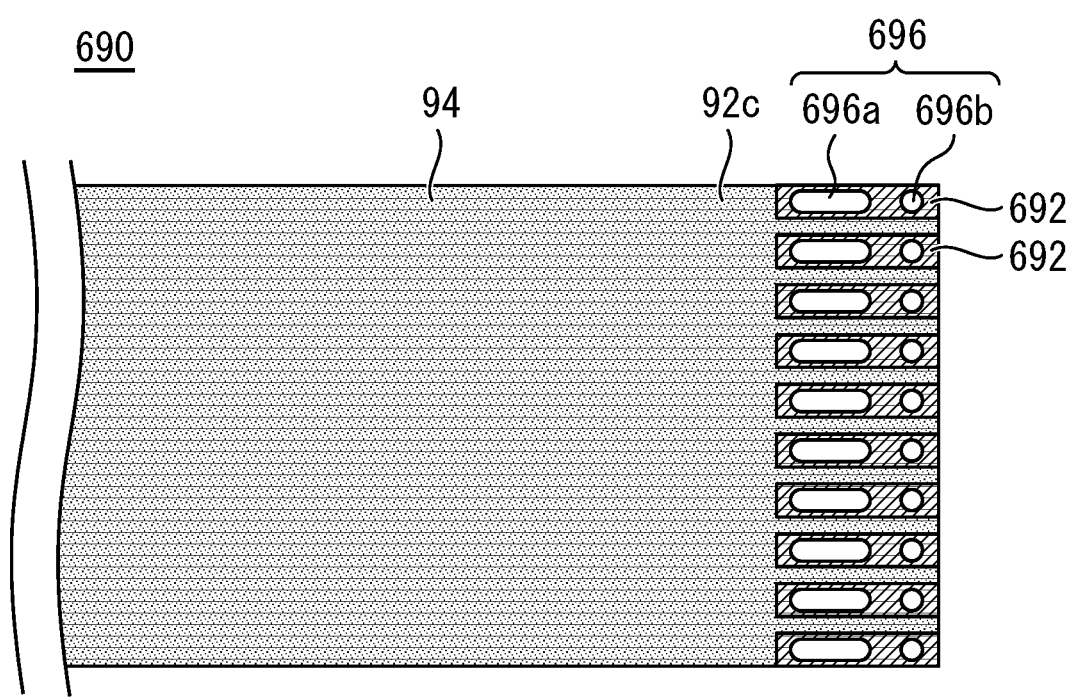
FIG. 12 is a plan view of a flexible substrate according to a modification example of the fourth embodiment.

FIG. 12 is a plan view of a flexible substrate 690 according to a modification example of the fourth embodiment. A plurality of through holes 696 are formed in an electrode 692 of the flexible substrate 690. A through hole 696a closest to the covered portion 92c among the plurality of through holes 696 is longer in a direction perpendicular to the side surface 81b of the feedthrough 81 than the other through holes 696b.

The through hole 696a is a long hole being long in a direction in which the electrode 692 extends. Accordingly, when the melted solder 70 is wet and spread to an end of the through hole 696a on the feedthrough 81 side, by capillary action due to the surface tension of the solder 70, the solder 70 is wet and spread to the covered portion 92c while the inside of the through hole 696a is filled with the solder 70. Thus, the solder 70 may more easily be wet and spread on a whole surface of the second exposed portion 92b.

Further, effects of a configuration of the fourth embodiment may further be improved by using the configuration in combination with the second or third embodiment.

Note that the technical features described in the above embodiments may be combined as appropriate.

REFERENCE SIGNS LIST

10 optical semiconductor device, 20 submount, 30 metal block, 40 thermo-module, 60, 70 solder, 80 case, 81 feedthrough, 82 receptacle, 83 lens, 84 wire, 85 first pattern, 86 second pattern, 90, 390, 490, 590, 690 flexible substrate, 91, 591 base, 92, 93, 392, 392-1, 392-2, 392-3, 492, 492-1, 492-2, 592, 593, 692 electrode, 94, 95 cover lay, 596, 696, 696a, 696b through hole, 100, 200, 300, 400, 500 optical module

The invention claimed is:

1. An optical module comprising:
   an optical semiconductor device;
   a package housing the optical semiconductor device;
   a first pattern provided on an upper surface of the package;
   a second pattern provided on a side surface continuous with the upper surface of the package;
   a flexible substrate provided on the first pattern and extending from the upper surface to a side surface side of the package; and
   solder joining the first pattern and the flexible substrate together,
   wherein the solder is spread from a portion of the flexible substrate, the portion extending from the upper surface to the side surface side of the package, to the second pattern.

2. The optical module according to claim 1, wherein the first pattern is continuous with the second pattern.

3. An optical module comprising:
   an optical semiconductor device;
   a package housing the optical semiconductor device;
   a first pattern provided on an upper surface of the package;
   a second pattern provided on a side surface continuous with the upper surface of the package;
   a flexible substrate provided on the first pattern and extending from the upper surface to a side surface side of the package; and
   solder joining the first pattern and the flexible substrate together, wherein
   the solder is spread between a portion of the flexible substrate, the portion extending from the upper surface to the side surface side of the package, and the second pattern, and
   the solder is spread to a lower end of the second pattern.

4. The optical module according to claim 1, wherein the flexible substrate includes an electrode and a cover lay covering the electrode,
   the electrode has:
     a first exposed portion that is provided directly above the upper surface of the package, is exposed from the cover lay, and is joined to the first pattern by the solder;
     a covered portion covered by the cover lay; and
     a second exposed portion that couples the first exposed portion and the covered portion together, is exposed from the cover lay, and is provided on an outside of the upper surface of the package when the second exposed portion is seen in a direction perpendicular to the upper surface, and
   the solder is spread on the second exposed portion.

5. The optical module according to claim 4, wherein the solder is spread to an end portion of the second exposed portion, the end portion being adjacent to the covered portion.

6. The optical module according to claim 4, wherein
the electrode included in the flexible substrate comprises a plurality of electrodes, and
the plurality of electrodes are aligned in a direction along the side surface of the package and have the second exposed portions with different lengths.

7. The optical module according to claim 4, wherein
the electrode included in the flexible substrate comprises a plurality of electrodes, and
the plurality of electrodes are aligned in a direction along the side surface of the package and have different widths in the direction along the side surface.

8. The optical module according to claim 4, wherein
a through hole is formed in the first exposed portion or the second exposed portion, and
the solder is provided in the through hole.

9. The optical module according to claim 8, wherein
the through hole is formed in the second exposed portion.

10. The optical module according to claim 8, wherein
the through hole is longitudinally long in a direction perpendicular to the side surface of the package.

11. The optical module according to claim 10, wherein
the through hole comprises a plurality of through holes, and
a through hole closest to the covered portion among the plurality of through holes is longer in the direction perpendicular to the side surface of the package than the other through holes.

12. The optical module according to claim 1, wherein
the flexible substrate is provided on an opposite side from a light emission side of the optical semiconductor device or from a light incident side of the optical semiconductor device in the package.

13. The optical module according to claim 1, wherein
the first pattern comprises a plurality of first pattern and the solder comprises plural pieces of solder,
the plurality of first patterns and the plural pieces of solder are aligned in a direction along the side surface of the package, and
portions of the plural pieces of solder spread between the flexible substrate and the second patterns have different lengths from the upper surface.

14. The optical module according to claim 1, wherein
the first pattern comprises a plurality of first pattern and the solder comprises plural pieces of solder,
the plurality of first patterns and the plural pieces of solder are aligned in a direction along the side surface of the package, and
portions of the plural pieces of solder spread between the flexible substrate and the second patterns have different widths in the direction along the side surface.

15. The optical module according to claim 1, wherein
the first pattern comprises a plurality of first pattern,
the plurality of first patterns are aligned in a direction along the side surface of the package, and
the second patterns are provided in positions corresponding to first patterns at both ends among the plurality of first patterns.

* * * * *